(12) United States Patent
Kondo et al.

(10) Patent No.: US 10,102,943 B2
(45) Date of Patent: Oct. 16, 2018

(54) FLAT SHIELDED CABLE, WIRE HARNESS AND SHIELDING MEMBER

(71) Applicant: YAZAKI CORPORATION, Tokyo (JP)

(72) Inventors: Hiroki Kondo, Susono (JP); Mizuki Shirai, Susono (JP); Daisuke Suzuki, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/718,269

(22) Filed: Sep. 28, 2017

(65) Prior Publication Data
US 2018/0130574 A1    May 10, 2018

(30) Foreign Application Priority Data

Nov. 10, 2016   (JP) ................... 2016-219369

(51) Int. Cl.
| | | |
|---|---|---|
| *H01B 7/08* | (2006.01) | |
| *H01B 7/00* | (2006.01) | |
| *H01B 11/10* | (2006.01) | |

(52) U.S. Cl.
CPC ......... *H01B 7/0861* (2013.01); *H01B 7/0045* (2013.01); *H01B 7/0823* (2013.01); *H01B 11/1091* (2013.01); *H01B 11/1008* (2013.01)

(58) Field of Classification Search
CPC ...................................................... H01B 7/08
USPC ......................................... 174/117 F, 117 A
See application file for complete search history.

(56) References Cited

U.S. PATENT DOCUMENTS

| | | | | |
|---|---|---|---|---|
| 3,475,213 A | * | 10/1969 | Stow ..................... | H01B 1/00 428/328 |
| 3,762,946 A | * | 10/1973 | Stow ..................... | H05K 3/242 428/551 |
| 5,003,126 A | * | 3/1991 | Fujii .................... | G02B 6/4403 174/115 |
| 6,824,857 B2 | * | 11/2004 | Lochun ............... | G08B 13/244 361/748 |
| 8,896,110 B2 | * | 11/2014 | Hu ...................... | H01L 23/3736 257/678 |

FOREIGN PATENT DOCUMENTS

| | | |
|---|---|---|
| JP | 2008-4464 A | 1/2008 |
| JP | 2011-165393 A | 8/2011 |

* cited by examiner

*Primary Examiner* — Chau N Nguyen
(74) *Attorney, Agent, or Firm* — Sughrue Mion, PLLC

(57) ABSTRACT

A flat shielded cable includes conductors arranged in parallel, an insulating jacket section that covers the conductors and has an exposed conductor section which exposes a part of at least one of the conductors, and a shielding member that covers the jacket section. The conductor is electrically connected to the shielding member via the exposed conductor section. The shielding member has a first layer made of shielding material and a second layer made of binder resin containing metal filler. A D90 particle diameter of the metal filler is 6 μm and a difference between a D10 particle diameter and a D95 particle diameter of the metal filler is 6 μm or more, and the metal filler is contained in the second layer in an amount of 65 wt % or more.

5 Claims, 6 Drawing Sheets

FIG.6

| | | | EXAMPLE | | | | | COMPARATIVE EXAMPLE | |
|---|---|---|---|---|---|---|---|---|---|
| | | | 1 | 2 | 3 | 4 | 5 | 1 | 2 |
| METAL FILLER | KIND | | Ag | Ag | Ag | Ag | Cu | Ag | Ag |
| | SIZE DISTRIBUTION | D10 | 1.6 | 1.9 | 3.8 | 10.0 | 1.9 | 1.4 | 3.1 |
| | | D50 | 3.6 | 7.1 | 11.5 | 29.7 | 3.1 | 3.1 | 4.9 |
| | | D90 | 6.7 | 16.4 | 29.1 | 60.2 | 6.2 | 5.9 | 7.5 |
| | | D95 | 8.0 | 20.7 | 36.8 | 72.5 | 8.2 | 6.9 | 8.7 |
| | D95−D10 | | 6.4 | 18.8 | 33.0 | 62.5 | 6.3 | 5.5 | 5.6 |
| | ADDITION AMOUNT (wt%) | | 80 | 75 | 70 | 65 | 80 | 85 | 90 |
| BINDER RESIN | | | EVA-BASED HOT MELT | | | | | | |
| CONTACT RESISTANCE | | | ◎ | ◎ | ◎ | ◎ | ○ | × | × |

FLAT SHIELDED CABLE, WIRE HARNESS AND SHIELDING MEMBER

CROSS REFERENCE TO RELATED APPLICATIONS

This application is based on Japanese Patent Application (No. 2016-219369) filed on Nov. 10, 2016, the contents of which are incorporated herein by reference.

BACKGROUND OF THE INVENTION

1. Field of the Invention

The present invention relates to a flat shielded cable, a wire harness and a shielding member.

2. Description of the Related Art

Recently, shielded electric wires are known in which electric wires are each entirely coated with a shielding layer, such as metal foil or metal braid, to prevent the malfunction of various kinds of electronic apparatuses due to external noise. Furthermore, flat shielded cables have also been proposed in which flat cables are each provided with a shielding layer. In this kind of flat shielded cable, the jacket section of a conductor being used as one of the plurality of parallelly arranged conductors of the flat cable and serving as a drain wire is removed to form an exposed conductor section, and the outer periphery of the flat cable is coated with a shielding member. The shielding member has a first layer made of, for example, metal foil and serving as a shielding layer for shutting off external noise and a second layer made of an adhesive layer containing conductive filler or made of conductive paste. The shielding member is wound around the flat cable with the second layer facing inside, whereby the adhesive layer containing the conductive filler or the conductive paste intervenes between the shielding layer and the exposed conductor section from which the jacket is removed, and the drain wire is electrically connected to the shielding layer via this intervening substance (refer to JP-A-2008-4464 and JP-A-2011-165393).

However, in the flat shielded cables according to JP-A-2008-4464 and JP-A-2011-165393, the intervening substance between the drain wire and the shielding layer has not been studied sufficiently, and the electrical connection between the conductor and the shielding layer lacks in stability, and there is a possibility that smooth grounding of noise may be hindered.

SUMMARY OF THE INVENTION

The present invention has been made to solve the above problems and an object of the present invention is to provide a flat shielded cable, a wire harness and a shielding member capable of enhancing the stability of the electrical connection between a conductor and a shielding layer.

A flat shielded cable according to the present invention includes:
- a plurality of conductors arranged in parallel to each other;
- an insulating jacket section that covers the plurality of conductors and has an exposed conductor section which exposes a part of at least one of the conductors; and
- a shielding member that covers an outer periphery of the jacket section,
- wherein the part of the at least one of the conductors is electrically connected to the shielding member via the exposed conductor section;
- wherein the shielding member has a first layer made of shielding material for shutting off external noise and a second layer made of binder resin containing metal filler, the second layer being provided so as to make contact with the conductor via the exposed conductor section; and
- wherein a D90 particle diameter of the metal filler contained in the binder resin is 6 µm and a difference between a D10 particle diameter and a D95 particle diameter of the metal filler is 6 µm or more, and the metal filler is contained in the second layer in an amount of 65 wt % or more.

With the flat shielded cable, the shielding member has the first layer made of the shielding material and the second layer made of the binder resin containing the metal filler and provided so as to make contact with the conductor via the exposed conductor section. In particular, since the metal filler being characterized in that the D90 particle diameter is 6 µm and that the difference between the D10 particle diameter and the D95 particle diameter is 6 µm or more is contained in the binder resin of the second layer in an amount of 65 wt % or more, the electrical connection between the conductor serving as a drain wire and the first layer serving as a shielding layer can be carried out while the contact resistance therebetween is suppressed, whereby the stability of the electrical connection between the conductor and the shielding layer can be enhanced.

Furthermore, in the flat shielded cable according to the present invention, for example, a contact resistance between the second layer and the conductor via the exposed conductor section is 100 mΩ or less and a bonding strength between the second layer and the conductor via the exposed conductor section is 0.3 N/19 mm or more.

With the flat shielded cable, the contact resistance between the second layer and the conductor via the exposed conductor section is 100 mΩ or less, thereby being capable of preventing a situation in which the resistance value is too large and noise is hardly grounded. Furthermore, the bonding strength between the second layer and the conductor via the exposed conductor section is 0.3 N/19 mm or more, thereby being capable of preventing a situation in which the shielding member is peeled and noise is hardly grounded.

Moreover, in the flat shielded cable according to the present invention, for example, the exposed conductor section is provided so as to expose a side section of one conductor located at one end of the plurality of conductors, and the shielding member is wound one or more turns around the jacket section.

With the flat shielded cable, since the exposed conductor section is formed so that the side section of the conductor located at the end of the plurality of conductors is exposed, in the case that the shielding member is wound one or more turns, the shielding layer is easily brought close to the side section of the conductor located at the end, and the stability of the electrical connection between the conductor and the shielding layer can be further enhanced.

Furthermore, a wire harness according to the present invention includes flat shielded cable described in any one of the above-mentioned items and a pressure contact connector connected to an end section of the flat shielded cable.

With this wire harness, since the wire harness includes the flat shielded cable described in any one of the above-mentioned items and the pressure contact connector connected to the end section of the flat shielded cable, the distance from the shielding member to the pressure contact blades of the connector can be made shorter, whereby the shielding performance on the side of the end section can be secured.

Still further, a shielding member according to the present invention has a first layer made of shielding material for shutting off external noise and a second layer made of binder resin containing metal filler, and a D90 particle diameter of the metal filler contained in the binder resin is 6 μm or more and to difference between a D10 particle diameter and a D95 particle diameter of the metal filler contained in the binder resin is 6 μm or more; and the metal filler is contained in the second layer in an amount of 65 wt % or more.

The shielding member has the first layer made of the shielding material and the second layer made of the binder resin containing the metal filler. In particular, since the metal filler being characterized in that the D90 particle diameter is 6 μm and that the difference between the D10 particle diameter and the D95 particle diameter is 6 μm or more is contained in the binder resin of the second layer in an amount of 65 wt % or more, the electrical connection between the conductor serving as a drain wire and the first layer serving as a shielding layer can be carried out while the contact resistance therebetween is suppressed, whereby the stability of the electrical connection between the conductor and the shielding layer can be enhanced.

The present invention can provide a flat shielded cable, a wire harness and a shielding member capable of enhancing the stability of the electrical connection between a conductor and a shielding layer.

BRIEF DESCRIPTION OF THE DRAWINGS

FIG. 6 is a table showing Examples and Comparative examples of the shielding member.

DETAILED DESCRIPTION OF THE EXEMPLARY EMBODIMENTS

The present invention will be described below along with a preferred embodiment. However, the present invention is not limited to the embodiment described below, but can be modified appropriately within the scope not departing from the gist of the present invention. Furthermore, although the illustration and description of some components are omitted in the embodiment described below, it is needless to say that known or well-known technologies are applied appropriately to the details of the omitted technologies within a range not causing inconsistency with the contents of the following description.

Figure 1:
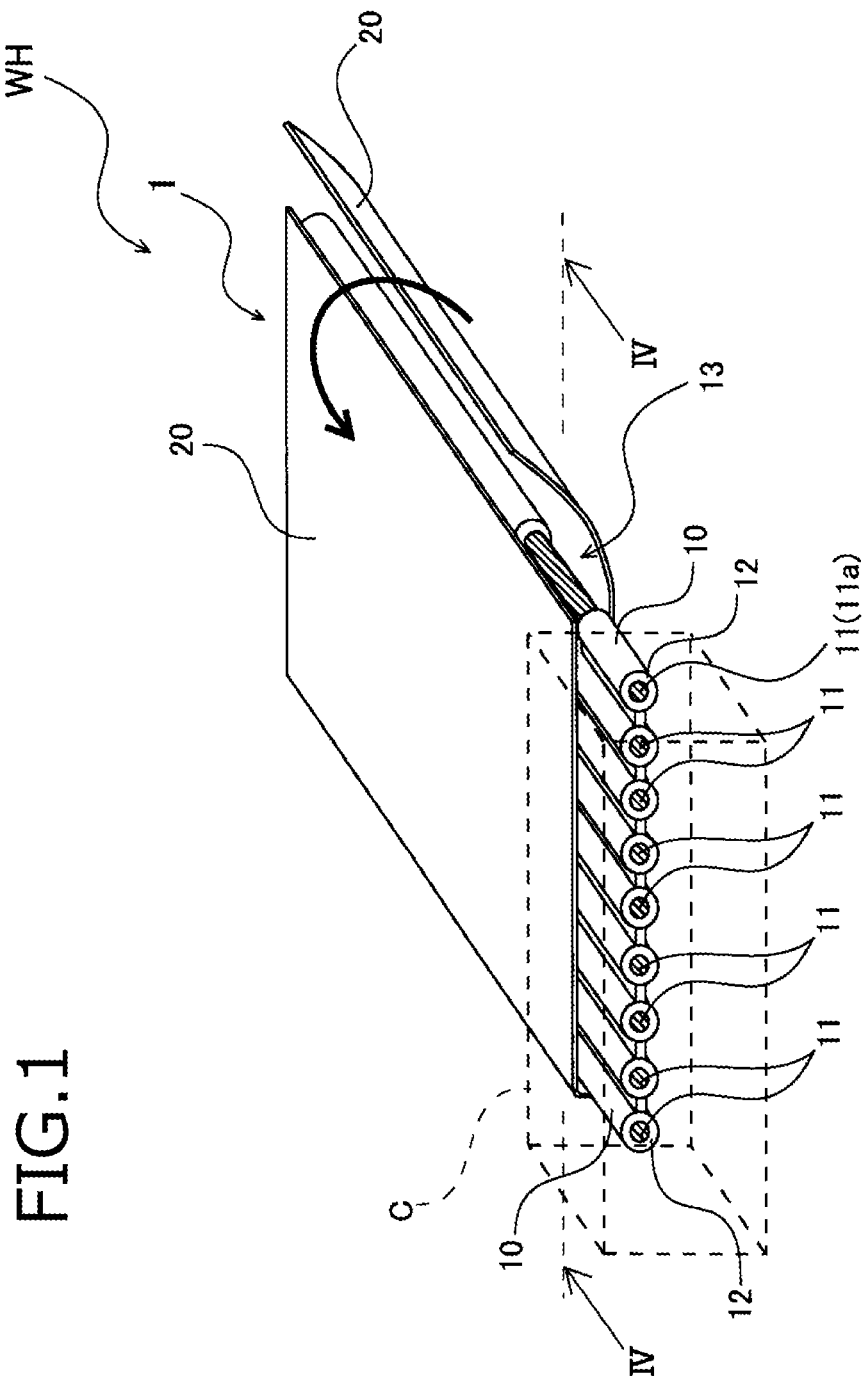
FIG. 1 is a perspective view showing a wire harness including a flat shielded cable according to an embodiment of the present invention.

FIG. 1 is a perspective view showing a wire harness including a flat shielded cable according to the embodiment of the present invention. As shown in FIG. 1, a wire harness WH is constituted by a flat shielded cable 1 and a pressure contact connector C. The flat shielded cable 1 is constituted by a flat cable 10 and a shielding member 20 wound around the outer periphery of the flat cable 10. Although the shielding member 20 is shown in a partially developed state for convenience of explanation in FIG. 1, it is assumed that the shielding member is not actually developed but is wound on the flat cable 10 as described later referring to FIG. 5.

The flat cable 10 is constituted by a plurality (nine in FIG. 1) of conductors 11 (for example, 0.09 sq. mm) arranged in parallel and an insulating jacket section 12 for covering the plurality of conductors 11. The pressure contact connector C has pressure contact blades made of metal and not fewer than the number of the plurality of conductors 11 in its interior. The pressure contact blades stick into the flat cable 10, thereby being respectively conductive with the plurality of conductors.

Figure 2:
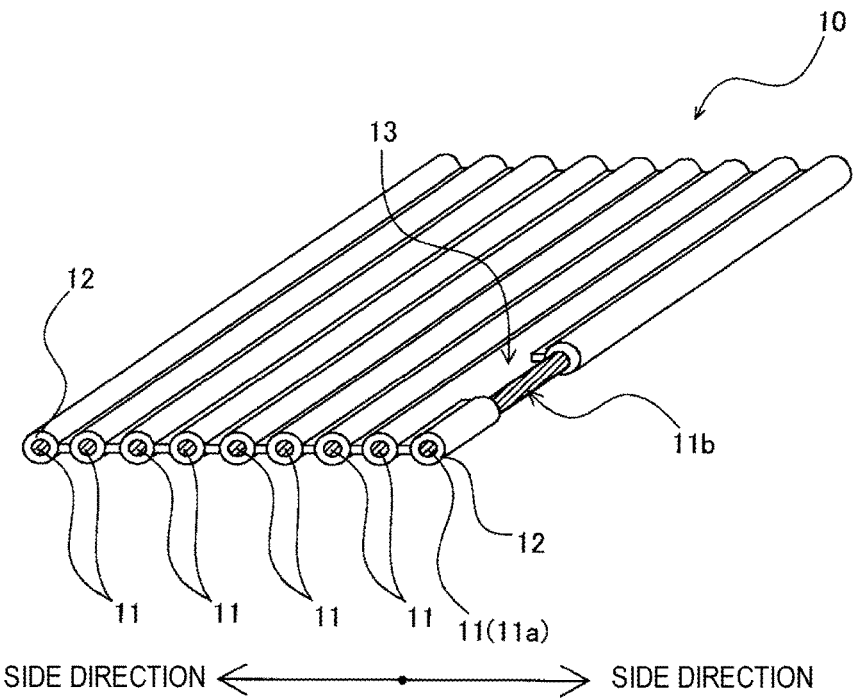
FIG. 2 is a perspective view showing the details of the flat cable shown in FIG. 1.

FIG. 2 is a perspective view showing the details of the flat cable 10 shown in FIG. 1. As shown in FIG. 2, an exposed conductor section 13 obtained by exposing part of a single conductor 11 is formed in the jacket section 12 of the flat cable 10. In particular, as shown in FIG. 2, of the plurality of conductors 11 arranged in parallel, the conductor 11a located at one end of the arrangement is formed with the exposed conductor section 13. Furthermore, the exposed conductor section 13 is exposed over the entire periphery thereof in a state of including the side section 11b (the end section on one side) of the conductor 11a located at the end.

Figure 3:
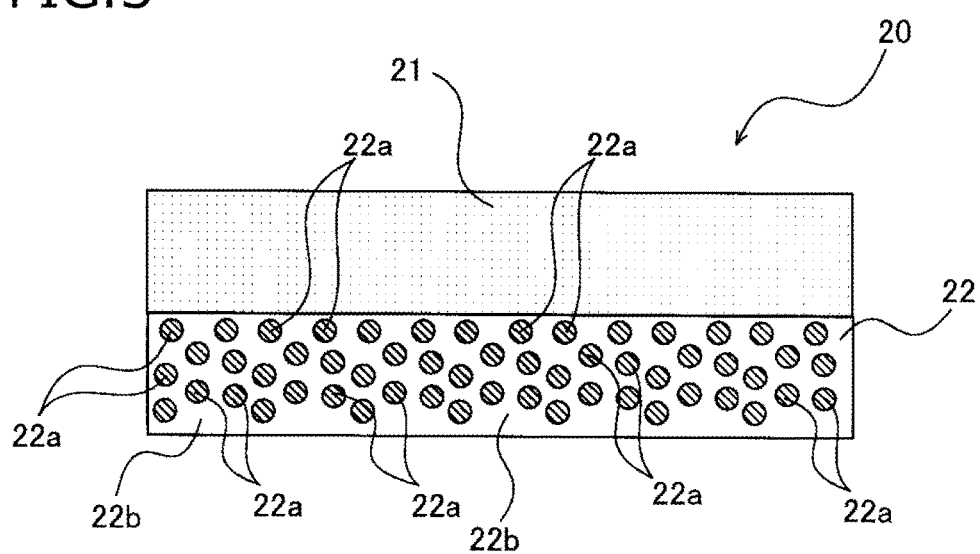
FIG. 3 is a cross-sectional view showing a shielding member, indicating a state before the shielding member is wound around the flat cable.

FIG. 3 is a cross-sectional view showing the shielding member 20, indicating a state before the shielding member 20 is wound around the flat cable 10. As shown in FIG. 3, the shielding member 20 has a first layer 21 and a second layer 22. The first layer 21 is made of a shielding material for shutting off external noise. The shielding material is metal foil such as copper foil. The second layer 22 is made of binder resin 22b containing metal filler 22a. The metal filler 22a is filler made of, for example, silver, copper or nickel. Of these types of filler, the types of filler made of silver and copper are preferable from the viewpoint of bonding strength and conductivity. Moreover, the binder resin 22b is made of hot melt resin (thermoplastic resin), thermosetting resin or adhesive, for example. EVA-based hot melt, synthetic rubber-based hot melt and olefin-based hot melt are taken as examples of the hot melt resin.

The metal filler 22a in this embodiment is characterized in that the D90 particle diameter is 6 μm and that the difference between the D10 particle diameter and the D95 particle diameter is 6 μm or more. Furthermore, the metal filler 22a is contained in the second layer 22 in an amount of 65 wt % or more. Of various particle diameters, the D90 particle diameter is a particle diameter corresponding to 90% of the cumulative undersize distribution. Hence, the D90 particle diameter of 6 μm indicates that the diameters of 90% particles of particles having various sizes are 6 μm or less. The D10 particle diameter and the D95 particle diameter are defined similarly.

In this embodiment, the stability of the electrical connection between the conductor 11a and the first layer 21 serving as a shielding layer can be enhanced by using the shielding member 20 wherein the above-mentioned second layer 22 serves as an intervening substance.

Figure 4:
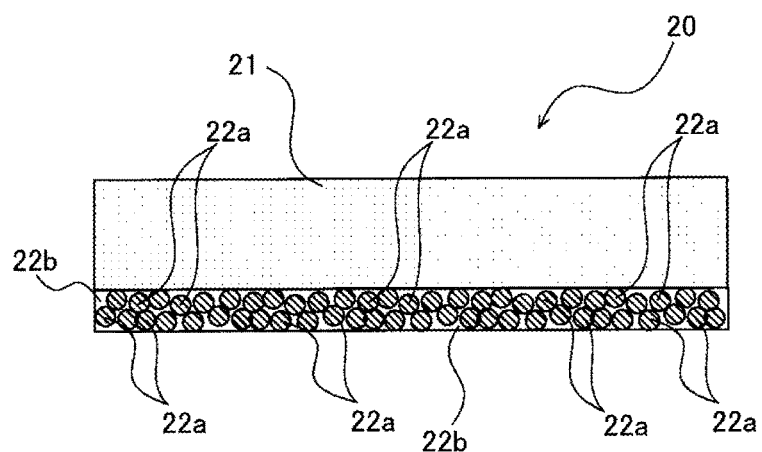
FIG. 4 is a cross-sectional view showing the shielding member, indicating a state in which the shielding member is wound around the flat cable and heat-treated.

FIG. 4 is a cross-sectional view showing the shielding member 20, indicating a state in which the shielding member 20 is wound around the flat cable 10 and heat-treated. The shielding member 20 shown in FIG. 4 is wound around the flat cable 10 and heat-treated, and the binder resin 22b of the second layer 22 is in a cured state. In the case that the binder resin 22b is thermosetting resin, the thermosetting resin is contracted by heating in this cured state. Hence, the metal filler 22a of the second layer 22 is exposed, whereby the conductor 11a is bonded to the first layer 21 serving as a shielding layer so that the electrical connection therebetween is satisfactory (that is, in a state in which the contact resistance therebetween is suppressed). On the other hand, in the case that the binder resin 22b is hot melt resin, the hot melt resin melts by heating, whereby the conductor 11a is bonded to the first layer serving as a shielding material so that the electrical connection therebetween is satisfactory (that is, in a state in which the contact resistance therebetween is suppressed).

More specifically, the contact resistance between the second layer 22 after the curing and the conductor 11a via the exposed conductor section 13 is 100 mΩ or less. This can prevent a situation in which the resistance value is too large and noise is hardly grounded. In other words, the noise induced to the shielding layer of the first layer 21 can be grounded properly via the conductor 11a serving as a drain wire. Furthermore, the bonding strength between the second layer 22 and the conductor 11a via the exposed conductor section 13 is 0.3 N/19 mm or more. This can prevent a situation in which the shielding member 20 is peeled and noise is hardly grounded. It is further preferable that the above-mentioned bonding strength should be 1 N/19 mm or more. With this bonding strength, it is possible to prevent a situation in which the shielding member is peeled under a relatively severe environment, for example, in particular, at portions of an automobile to which vibration is applied, whereby the shielding performance at such portions can be secured.

Figure 5:
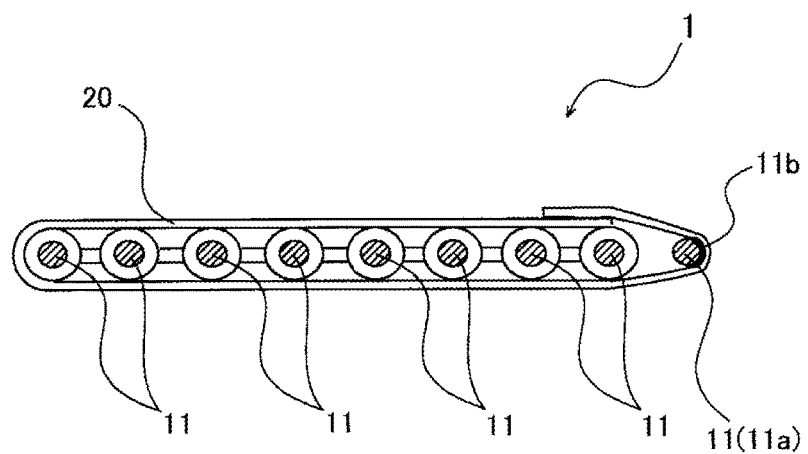
FIG. 5 is a cross-sectional view taken on line IV-IV shown in FIG. 1.

FIG. 5 is a cross-sectional view taken on line IV-IV shown in FIG. 1. FIG. 5 shows a state in which the shielding member 20 is wound around instead of being developed as shown in FIG. 1.

As shown in FIG. 5, in this embodiment, the shielding member 20 is wound one or more turns while making contact with the exposed conductor section 13. Furthermore, in this embodiment, after being wound, the shielding member 20 is heat-treated, whereby the second layer 22 having the melted or contracted binder resin 22b makes contact with the conductor 11a located at the end of the plurality of conductors 11 via the exposed conductor section 13. In particular, since the side section 11b of the conductor 11a located at the end is exposed via the exposed conductor section 13 in this embodiment, in the case that the shielding member 20 is wound one or more turns, the shielding member 20 is liable to become close to the side section 11b and tends to make strong contact with the side section 11b. Hence, the electrical connection between the conductor 11a and the shielding member 20 can be carried out easily.

Next, a method for manufacturing the wire harness WH according to this embodiment will be described. First, the flat cable 10 is prepared, and the exposed conductor section is formed by peeling the jacket section 12 so that part of the conductor 11a located at the end is exposed. At this time, the exposed conductor section 13 is formed so that the side section 11b of the conductor 11a is exposed.

Next, the shielding member 20 having the first layer 21 made of metal foil, such as copper foil, and the second layer 22 made of the binder resin 22b containing the metal filler 22a is prepared and wound around the flat cable 10 one or more turns. The metal filler 22a is contained in the second layer 22 in an amount of 65 wt % or more before heating, and the metal filler 22a is characterized in that the 90D particle diameter of the metal filler 22a is 6 μm and that the difference between the D10 particle diameter and the D95 particle diameter is 6 μm or more.

The assembly constituted by the flat cable 10 and the shielding member 20 is then subjected to heat treatment. The heat treatment is carried out for two seconds or more and one hour or less at 60° C. or more and 250° C. or less. Consequently, the flat shielded cable 1 is manufactured.

Next, the pressure contact connector C is prepared, and the pressure contact connector C is connected to the end section of the flat shielded cable 1. As a result, the wire harness WH shown in FIG. 1 is manufactured.

Next, Examples and Comparative examples of the shielding member 20 will be described below. FIG. 6 is a table showing Examples and Comparative examples of the shielding member.

First, in Example 1, Silflake 010 made by Technic was used as metal filler. This metal filler is silver filler. The particle size distribution of the filler is as given below: the D10 particle diameter is 1.6 μm, the D50 particle diameter is 3.6 μm, the D90 particle diameter is 6.7 μm, and the D95 particle diameter is 8.0 μm. Hence, the difference between the D10 particle diameter and the D95 particle diameter is 6.4 μm. Furthermore, EVA-based hot melt (Scotch-Weld 3747 made by 3M) was used as binder resin. In this binder resin, the above-mentioned metal filler was contained in an amount of 80 wt % to form a conductive adhesive layer, and a contact resistance evaluation test was conducted as described later using this conductive adhesive layer.

In Example 2, Silflake 396 made by Technic was used as metal filler. This metal filler is silver filler. The particle size distribution of the filler is as given below: the D10 particle diameter is 1.9 μm, the D50 particle diameter is 7.1 μm, the D90 particle diameter is 16.4 μm, and the D95 particle diameter is 20.7 μm. Hence, the difference between the D10 particle diameter and the D95 particle diameter is 18.8 μm. Furthermore, EVA-based hot melt (Scotch-Weld 3747 made by 3M) was used as binder resin. In this binder resin, the above-mentioned metal filler was contained in an amount of 75 wt % to form a conductive adhesive layer, and a contact resistance evaluation test was conducted as described later using this conductive adhesive layer.

In Example 3, Silflake 135 made by Technic was used as metal filler. This metal filler is silver filler. The particle size distribution of the filler is as given below: the D10 particle diameter is 3.8 μm, the D50 particle diameter is 11.5 μm, the D90 particle diameter is 29.1 μm, and the D95 particle diameter is 36.8 μm. Hence, the difference between the D10 particle diameter and the D95 particle diameter is 33.0 μm. Furthermore, EVA-based hot melt (Scotch-Weld 3747 made by 3M) was used as binder resin. In this binder resin, the above-mentioned metal filler was contained in an amount of 70 wt % to form a conductive adhesive layer, and a contact resistance evaluation test was conducted as described later using this conductive adhesive layer.

In Example 4, Silflake 026 made by Technic was used as metal filler. This metal filler is silver filler. The particle size distribution of the filler is as given below: the D10 particle diameter is 10.0 μm, the D50 particle diameter is 29.7 μm, the D90 particle diameter is 60.2 μm, and the D95 particle diameter is 72.5 μm. Hence, the difference between the D10 particle diameter and the D95 particle diameter is 62.5 μm.

Furthermore, EVA-based hot melt (Scotch-Weld 3747 made by 3M) was used as binder resin. In this binder resin, the above-mentioned metal filler was contained in an amount of 65 wt % to form a conductive adhesive layer, and a contact resistance evaluation test was conducted as described later using this conductive adhesive layer.

In Example 5, the metal filler described below was made and used. That is to say, the metal filler is copper filler. The particle size distribution of the filler is as given below: the D10 particle diameter is 1.9 μm, the D50 particle diameter is 3.1 μm, the D90 particle diameter is 6.2 μm, and the D95 particle diameter is 8.2 μm. Hence, the difference between the D10 particle diameter and the D95 particle diameter is 6.3 μm. Furthermore, EVA-based hot melt (Scotch-Weld 3747 made by 3M) was used as binder resin. In this binder resin, the above-mentioned metal filler was contained in an amount of 80 wt % to form a conductive adhesive layer, and a contact resistance evaluation test was conducted as described later using this conductive adhesive layer.

In Comparative example 1, the metal filler described below was made and used. That is to say, the metal filler is silver filler. The particle size distribution of the filler is as given below: the D10 particle diameter is 1.4 μm, the D50 particle diameter is 3.1 μm, the D90 particle diameter is 5.9 μm, and the D95 particle diameter is 6.9 μm. Hence, the difference between the D10 particle diameter and the D95 particle diameter is 5.5 μm. Furthermore, EVA-based hot melt (Scotch-Weld 3747 made by 3M) was used as binder resin. In this binder resin, the above-mentioned metal filler was contained in an amount of 85 wt % to form a conductive adhesive layer, and a contact resistance evaluation test was conducted as described later using this conductive adhesive layer.

In Comparative example 2, the metal filler described below was made and used. That is to say, the metal filler is silver filler. The particle size distribution of the filler is as given below: the D10 particle diameter is 3.1 μm, the D50 particle diameter is 4.9 μm, the D90 particle diameter is 7.5 μm, and the D95 particle diameter is 8.7 μm. Hence, the difference between the D10 particle diameter and the D95 particle diameter is 5.6 μm. Furthermore, EVA-based hot melt (Scotch-Weld 3747 made by 3M) was used as binder resin. In this binder resin, the above-mentioned metal filler was contained in an amount of 90 wt % to form a conductive adhesive layer, and a contact resistance evaluation test was conducted as described later using this conductive adhesive layer.

Figure 7:
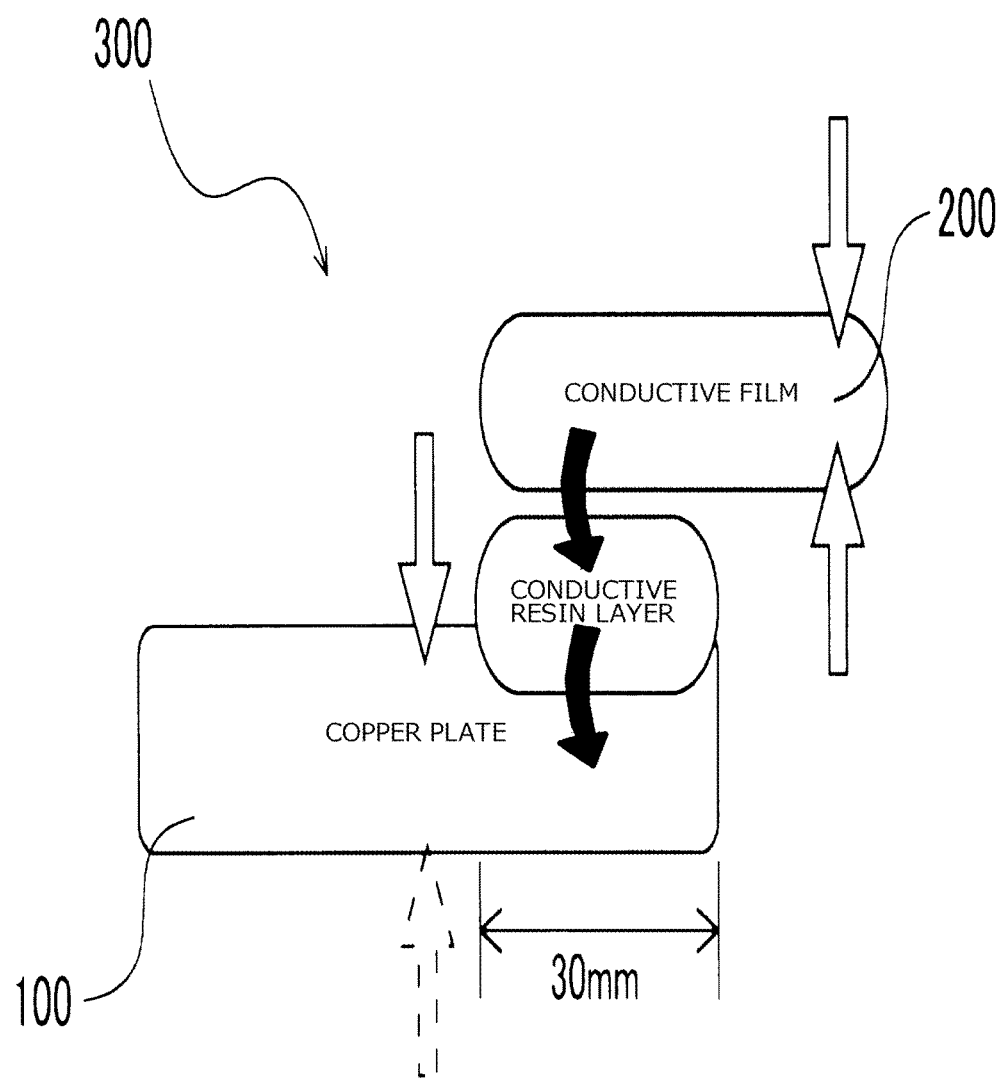
FIG. 7 is a conceptual view showing a contact resistance evaluation test.

The contact resistance evaluation test was conducted as described below. FIG. 7 is a conceptual view showing the contact resistance evaluation test. First, a copper plate 100 measuring 19 mm in width and 140 mm in length was prepared. In addition, a conductive film 200 measuring 19 mm in width and 140 mm in length and obtained by subjecting a PET film to copper-plating and tin-plating was prepared. Next, one end side of the copper plate 100 was overlapped with the other end side of the conductive film 200 by 30 mm, and the conductive adhesive layer of each of Examples 1 to 5 and Comparative examples 1 and 2 was provided to intervene therebetween. These were then heated at 200° C. for only five seconds to obtain a test piece 300.

Next, the resistance value of the test piece 300 was measured using a four-terminal method. At this time, the respective terminals were connected to the respective portions (indicated by arrows) shown in FIG. 7. However, it is assumed that the broken-line arrow indicates a portion on the back face side. Furthermore, for the terminal connection to the conductive film 200, it is needless to say that the terminals were connected to the tin-plated faces of the conductive film.

As shown in FIG. 6, a measured resistance value (contact resistance value) of 50 mΩ or less is indicated by "⊙", a resistance value of more than 50 mΩ and 100 mΩ or less is indicated by "○", and a resistance value of more than 100 mΩ is indicated by "x". As a result, the resistance values of Examples 1 to 4 are indicated by "⊙", the resistance value of Example 5 is indicated by "○", and the resistance values of Comparative examples 1 and 2 are indicated by "x".

Furthermore, according to the above-mentioned test results, various kinds of calculations, etc., it has been found that the metal filler 22a contained in the binder resin 22b is characterized in that the 90D particle diameter of the metal filler 22a is 6 μm or more and that the difference between the D10 particle diameter and the D95 particle diameter is 6 μm or more, and it has also been found that, in the case that the metal filler is contained in the second layer 22 in an amount of 65 wt % or more, the contact resistance value of the test piece is 100 mΩ or less.

More specifically, in Comparative example 2, although the D90 particle diameter is 6 μm or more and the addition amount of the metal filler is 90 wt %, sufficiently exceeding 65 wt %, since the difference between the D10 particle diameter and the D95 particle diameter is less than 6 μm, the contact resistance value has resulted in exceeding 100 mΩ. Furthermore, also in the case that the D90 particle diameter is less than 6 μm as in Comparative example 1, although the addition amount has a sufficient value of 85 wt %, the contact resistance value has resulted in exceeding 100 mΩ.

On the other hand, in Examples 1 to 5 wherein the D90 particle diameter is 6 μm or more, the difference between the D10 particle diameter and the D95 particle diameter is 6 μm or more, and the metal filler is contained in the second layer 22 in an amount of 65 wt % or more, the contact resistance values have resulted in 100 mΩ or less. Furthermore, in Examples 1 to 4 wherein the silver filler is used, the D90 particle diameter is 6.7 μm or more, the difference between the D10 particle diameter and the D95 particle diameter is 6.4 μm or more, and the metal filler is contained in the second layer 22 in an amount of 65 wt % or more, the contact resistance values have resulted in 50 mΩ or less.

As described above, in the flat shielded cable 1 according to this embodiment, the shielding member 20 has the first layer 21 made of a shielding material and the second layer 22 made of the binder resin 22b containing the metal filler 22a and provided so as to make contact with the conductor 11a via the exposed conductor section 13. In particular, since the metal filler 22a being characterized in that the D90 particle diameter is 6 μm and that the difference between the D10 particle diameter and the D95 particle diameter is 6 μm or more is contained in the binder resin 22b of the second layer 22 in an amount of 65 wt % or more, the electrical connection between the conductor 11a serving as a drain wire and the first layer 21 serving as a shielding layer can be carried out while the contact resistance therebetween is suppressed, whereby the stability of the electrical connection between the conductor 11a and the shielding layer can be enhanced.

In addition, the contact resistance between the second layer 22 and the conductor 11a via the exposed conductor section 13 is 100 mΩ or less, thereby being capable of preventing a situation in which the resistance value is too large and noise is hardly grounded. Furthermore, the bonding strength between the second layer 22 and the conductor 11a via the exposed conductor section 13 is 0.3 N/19 mm or more, thereby being capable of preventing a situation in which the shielding member 20 is peeled and noise is hardly grounded.

Moreover, since the exposed conductor section 13 is formed so that the side section 11b of the conductor 11a located at the end of the plurality of conductors 11 is exposed, in the case that the shielding member 20 is wound one or more turns, the shielding layer is easily brought close to the side section 11b of the conductor 11a located at the end, and the stability of the electrical connection between the conductor 11a and the shielding layer can be further enhanced.

Still further, since the wire harness WH according to this embodiment includes the flat shielded cable 1 and the pressure contact connector C connected to the end section of the flat shielded cable 1, the distance from the shielding member 20 to the pressure contact blades of the connector can be made shorter, whereby the shielding performance on the side of the end section can be secured.

Figure 8:
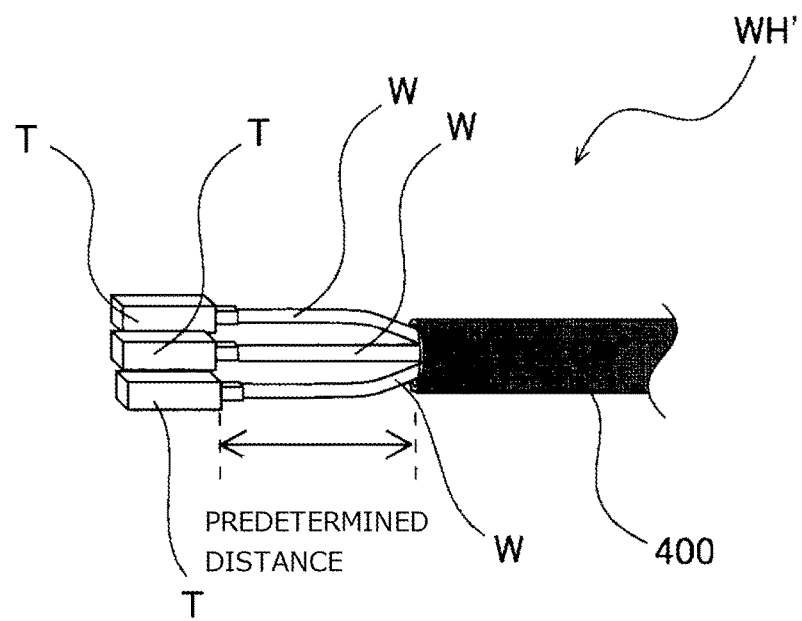
FIG. 8 is a side view showing a wire harness according to a comparative example.

This point will be described below in detail. FIG. 8 is a side view showing a wire harness according to a comparative example. As shown in FIG. 8, in the wire harness WH' according to the comparative example, terminals T are crimped to the end sections of a plurality of wires W and then the terminals T are inserted into a connector (not shown). In the case of this configuration, since the terminals T are inserted into the connector, a shielding member 400 is wound around the wires W while being away from the terminals by a predetermined distance in consideration of terminal insertion property. Hence, a gap corresponding to the predetermined distance occurs, whereby the shielding performance on the side of the end section cannot be secured. On the other hand, in this embodiment, it is not necessary to consider the terminal insertion property described above, whereby the shielding member 20 can be brought close to the pressure contact blades of the consider C as much as possible.

Although the wire harness WH' equipped with the plurality of electric wires W and the shielding member 400 is taken as an example and described in FIG. 8, the wire harness is not limited to have this configuration. Even in the case of a wire harness equipped with a flat cable and the shielding member 400, it is needless to say that the shielding performance on the side of the end section is secured in a similar way.

What's more, the shielding member 20 according to this embodiment has the first layer 21 made of a shielding material and the second layer 22 made of the binder resin 22b containing the metal filler 22a. In particular, since the metal filler 22a being characterized in that the D90 particle diameter is 6 μm and that the difference between the D10 particle diameter and the D95 particle diameter is 6 μm or more is contained in the binder resin 22b of the second layer 22 in an amount of 65 wt % or more, the electrical connection between the conductor 11a serving as a drain wire and the first layer 21 serving as a shielding layer can be carried out while the contact resistance therebetween is suppressed, whereby the stability of the electrical connection between the conductor 11a and the shielding layer can be enhanced.

Although the present invention has been described above on the basis of the embodiment, the present invention is not limited to the above-mentioned embodiment, but can be modified or combined with other technologies (including well-known and known technologies) within the scope not departing from the gist of the present invention.

For example, although the plurality of conductors 11 is arranged in parallel on a single plane in the flat cable 10 according to the above-mentioned embodiment, the plurality of conductors 11 may be arranged in parallel on two or more planes. Furthermore, the flat cable 10 is not limited to the flat cable having nine conductors 11 (nine-core cable), but may merely have two or more conductors 11.

Furthermore, although the exposed conductor section 13 is configured such that part of the single conductor 11 is exposed in the longitudinal direction thereof, the exposed conductor section may be configured such that the whole of the single conductor is exposed in the longitudinal direction. Moreover, the exposed conductor section 13 may be formed such that two or more connectors 11 are exposed.

Still further, although the shielding member 20 is constituted by the first layer 21 made of metal foil, such as copper foil, and the second layer 22 made of the binder resin 22b containing the metal filler 22a, the shielding member 20 may further be equipped with third or more layers.

Additionally, the end sections of the shielding member 20 are not limited to be overlapped and bonded to each other as shown in FIG. 5, but may be abutted and bonded to each other, provided that the shielding member 20 is wound one or more turns.

What is claimed is:

1. A flat shielded cable comprising:
   a plurality of conductors arranged in parallel to each other;
   an insulating jacket section that covers the plurality of conductors and has an exposed conductor section which exposes a part of at least one of the conductors;
   and a shielding member that covers an outer periphery of the jacket section, wherein the part of the at least one of the conductors is electrically connected to the shielding member via the exposed conductor section;
   wherein the shielding member has a first layer comprised of shielding material for shutting off external noise and a second layer comprised of binder resin containing metal filler, the second layer being provided so as to make contact with the conductor via the exposed conductor section;
   wherein a D90 particle diameter of the metal filler contained in the binder resin is 6 μm or more and a difference between a D10 particle diameter and a D95 particle diameter of the metal filler is 6 μm or more, and the metal filler is contained in the second layer in an amount of 65 wt % or more; and
   wherein the part exposed in the exposed conductor section comprises a surface of the at least one of the conductors, the surface being along a whole circumference of the at least one of the conductors.

2. The flat shielded cable according to claim 1, wherein a contact resistance between the second layer and the conductor via the exposed conductor section is 100 mΩ or less and a bonding strength between the second layer and the conductor via the exposed conductor section is 0.3 N/19 mm or more.

3. The flat shielded cable according to claim 1, wherein the at least one of the conductors is located at one end of the plurality of conductors; and wherein the shielding member is wound one or more turns around the jacket section.

4. A wire harness comprising:
   the flat shielded cable according to claim 1; and
   a pressure contact connector connected to an end section of the flat shielded cable.

5. The flat shielded cable according to claim 1, wherein the binder resin is a hot melt resin.

* * * * *